US011682600B2

(12) United States Patent
Leitgeb et al.

(10) Patent No.: US 11,682,600 B2
(45) Date of Patent: Jun. 20, 2023

(54) PROTECTION LAYER FOR PANEL HANDLING SYSTEMS

(71) Applicant: AT&S Austria Technologie & Systemtechnik Aktiengesellschaft, Leoben (AT)

(72) Inventors: Markus Leitgeb, Trofaiach (AT); Marco Gavagnin, Leoben (AT); Heinz Habenbacher, St. Peter-Freienstein (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/534,459

(22) Filed: Aug. 7, 2019

(65) Prior Publication Data

US 2021/0043529 A1 Feb. 11, 2021

(51) Int. Cl.
*H01L 23/31* (2006.01)
*H01L 23/32* (2006.01)
*H01L 23/498* (2006.01)

(52) U.S. Cl.
CPC .......... *H01L 23/3121* (2013.01); *H01L 23/32* (2013.01); *H01L 23/49811* (2013.01)

(58) Field of Classification Search
None
See application file for complete search history.

(56) References Cited

U.S. PATENT DOCUMENTS

| 5,410,451 | A | 4/1995 | Hawthorne et al. |
| 5,661,339 | A | 8/1997 | Clayton |
| 6,049,975 | A | 4/2000 | Clayton |
| 6,613,413 | B1 | 9/2003 | Japp et al. |
| 6,754,551 | B1 | 6/2004 | Zohar et al. |
| 6,921,451 | B2 | 7/2005 | Wilheim |
| 7,796,399 | B2 | 9/2010 | Clayton et al. |

(Continued)

FOREIGN PATENT DOCUMENTS

| CN | 1747154 A | 3/2006 |
| CN | 101930943 A | 12/2010 |

(Continued)

OTHER PUBLICATIONS

Lachaud, S.; Extended European Search Report in Application No. 20188201.6; pp. 1-8; Jan. 19, 2021 European Patent Office, 80298, Munich Germany.

(Continued)

*Primary Examiner* — Jay C Chang
(74) *Attorney, Agent, or Firm* — Robert A. Blaha; Smith Tempel Blaha LLC

(57) ABSTRACT

An arrangement includes a panel configured as a pre-form for manufacturing a plurality of component carriers; a protection layer covering a surface portion of a main surface of the panel, wherein the protection layer is detachable from the surface portion without leaving residues on the panel. A handling tool for handling the panel includes a surface onto which the panel is arrangeable. The panel includes a handling surface, with which the panel is arrangeable onto the handling tool, wherein the handling surface comprises at least part of the surface portion covered by the protection layer.

21 Claims, 3 Drawing Sheets

(56) References Cited

U.S. PATENT DOCUMENTS

| | | | | |
|---|---|---|---|---|
| 2007/0212816 | A1* | 9/2007 | Nishimura | H01J 37/32743 438/109 |
| 2007/0295437 | A1* | 12/2007 | Lee | H01L 21/67132 156/60 |
| 2008/0119054 | A1* | 5/2008 | Nambu | H01L 21/31116 438/700 |
| 2008/0134498 | A1* | 6/2008 | Gieskes | H05K 13/0417 269/903 |
| 2008/0141509 | A1 | 6/2008 | Nishimura | |
| 2009/0121337 | A1* | 5/2009 | Abe | H01L 21/565 257/686 |
| 2009/0322538 | A1* | 12/2009 | Kobren | G09F 3/0292 427/258 |
| 2013/0302969 | A1* | 11/2013 | Priewasser | H01L 21/82 438/458 |
| 2015/0001708 | A1* | 1/2015 | Lin | H01L 25/50 257/737 |
| 2018/0102509 | A1 | 4/2018 | Kim | |
| 2018/0108565 | A1* | 4/2018 | Sekiya | H01L 21/78 |
| 2018/0247870 | A1* | 8/2018 | Priewasser | H01L 21/78 |
| 2019/0088480 | A1* | 3/2019 | Budd | B24B 7/228 |
| 2020/0185276 | A1* | 6/2020 | Kumazawa | H01L 21/6835 |

FOREIGN PATENT DOCUMENTS

| | | |
|---|---|---|
| CN | 105837891 A | 8/2016 |
| CN | 107919437 A | 4/2018 |
| CN | 108140609 A | 6/2018 |
| CN | 108155142 A | 6/2018 |
| CN | 108650776 A | 10/2018 |
| CN | 109148515 A1 | 1/2019 |
| JP | 2014130853 A | 7/2014 |
| JP | 2018190858 A | 11/2018 |
| KR | 20180000429 A | 1/2018 |
| KR | 20190075500 A | 7/2019 |
| WO | 2014171649 A1 | 10/2014 |
| WO | 2019123647 A1 | 6/2019 |

OTHER PUBLICATIONS

English Translation of Notification of First Office Action in Application No. 202010789003.3; The China National Intellectual Property Administration; pp. 1-3; Jun. 30, 2021; No. 6, Xitucheng Lu, Jimenqiao Haidian District, Beijing, 100088, China.

First Office Action in Application No. 202010789003.3; The China National Intellectual Property Administration; pp. 1-10; Jun. 30, 2021; No. 6, Xitucheng Lu, Jimenqiao Haidian District, Beijing, 100088, China.

Second Office Action in Application No. 202010789003.3; pp. 1-8; Feb. 8, 2022; China National Intellectual Property Administration; No. 6, Xitucheng Lu, Jimenqiao Haidian District, Beijing City, 100088, China.

English Translation of cover pages of Second Office Action in Application No. 202010789003.3; pp. 1-3; Feb. 8, 2022; China National Intellectual Property Administration; No. 6, Xitucheng Lu, Jimenqiao Haidian District, Beijing City, 100088, China.

* cited by examiner

PROTECTION LAYER FOR PANEL HANDLING SYSTEMS

TECHNICAL FIELD

Various embodiments relate to a handling arrangement as well as a corresponding method for handling panels, which are configured as pre-forms for manufacturing a plurality of component carriers.

TECHNOLOGICAL BACKGROUND

Wafer processing involves many well-established and standardized technologies, for example for transferring wafers between different production machines or tools in the manufacturing flow. For such transfer, storing devices such as Front Opening Unified Pods (FOUPs), e.g. magazines, cassettes and all kind of product carrier, can be used to hold wafers securely and safely and to provide a controlled environment for the wafers during transport. Wafers in a FOUP are accessed through a pod door on the front side. The pod door interfaces with tool load ports, with which wafers are loaded into or removed from the FOUP and loaded into or removed from different production tools.

In recent times, various processing steps are increasingly realized in terms of panel level packaging (PLP). This development can be viewed as merging embedded die technologies on the level of printed wiring boards (PWB) with fan-out wafer-level packaging (FOWLP) on the wafer level. When some of the established and standardized technologies for wafer processing are transferred to panel processing, challenges arise because the handling and processing of wafers differs substantially from the handling and processing of panels. For example, while wafers generally have only one active side, large panels often have active areas on both main surfaces.

SUMMARY

As a result, the need arises to make use of some of the established and standardized technologies in wafer processing for panel processing while overcoming challenges due to the differences between both types of processing.

According to a first aspect, an arrangement comprises (i) a panel configured as a pre-form for manufacturing a plurality of component carriers, (ii) a protection layer (protection layer structure) covering a surface portion of a main surface of the panel, wherein the protection layer is detachable from the surface portion leaving (substantially) no residues (in particular no removable residues) on the panel, and (iii) a handling tool for handling the panel, wherein the handling tool comprises a surface onto which the panel is arrangeable. The panel comprises a handling surface, with which the panel is arrangeable onto the handling tool, wherein the handling surface comprises at least part of the surface portion covered by the protection layer.

According to a second aspect, a method of handling a panel comprises (i) providing a panel configured as a pre-form for manufacturing a plurality of component carriers, (ii) covering a surface portion of a main surface of the panel with a protection layer, wherein the protection layer is detachable from the surface portion leaving (substantially) no residues (in particular no removable residues) on the panel, and (iii) handling the panel by contacting exclusively the protection layer.

OVERVIEW OF EMBODIMENTS

In the context of the present application, a "panel" is a pre-form for manufacturing a plurality of component carriers. In particular, a panel may comprise a two-dimensional matrix of unfinished or finished component carriers. Each of the component carriers in the matrix may have a similar or even an identical structure or set-up and they may be in a similar or identical processing stage. Each of the component carriers may be attached to adjacent component carriers in one or both dimensions of the matrix. In addition, the panel may comprise a frame surrounding the matrix. A panel may have various geometric forms, it may for example have a rectangular, a quadrangular, a circular or an oval form. After manufacturing the panel, the individual component carriers may be singularized.

In the context of the present application, a "pre-form" of a manufactured object refers to the object in an unfinished state, i.e. when the object is not yet fully manufactured. In an unfinished state of a manufactured object, at least one processing or manufacturing step still has to be performed on the object. A "pre-form" of a manufactured object may be a semi-finished or intermediate product, which is used as input in the production of other products including final products.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, a "protection layer" is any layer that contributes to the protection of an object by at least partly covering the object, in particular any layer, whose primary function is to provide protection. A protection layer may be applied to at least part of the surface of an object such that it protects the object and in particular the part of the surface of the object to which the protection layer is applied from outward influences. A protection layer may for example protect from radiation and/or from various kinds of mechanical influences. A protection layer on a surface may protect from pressure that is exerted on the surface or from abrasion and scratching that may result, when another object is moved over the surface.

The protection layer may be a continuous layer, a patterned layer, or a plurality of non-consecutive islands formed on the surface of one or several objects. The thickness of the protection layer may vary or it may be constant. The protection layer may have a thickness of 0.01-500 μm (Micrometer).

The protection layer may be a single layer or a stack of multiple layers. It may comprise at least one of a film, a foil, a liquid, a fluid and a solid plate.

In the context of the present application, a layer is "detachable" from a surface if it can be removed from the surface. A layer is detachable without residues from a surface if the layer can be removed so that very little material, in particular no material, of the layer remains on the surface. Very little material may for example denote less than one hundredth, in particular less than one thousandth of the amount of material or of the mass of the layer. Specifically, all removable residues may be removed. A layer may be detachable if the adhesiveness between the layer and the surface is smaller, in particular much smaller, than the internal cohesiveness of the surface material of the object.

Detachability of a layer from a surface may imply that the layer can be detached without damaging the surface, in particular without compromising any functionality of the surface or of the object comprising the surface. For example, when the surface comprises electrical contacts and/or conductive paths, the functioning of these electrical contacts and/or conductive paths should not be affected by the attachment and subsequent removal of the protective layer. For example, little or no material from the underlying surface shall be removed, when the protective layer is detached. The layer may be detachable by a mechanical process such as by washing off, by blowing off or by scratching off the layer. It may further be detachable by an optical process such as a laser process or by a chemical process such as by etching off. The residue-free removal of the protection layer may also require a process involving a number of steps, which may include optical, mechanical and/or chemical process steps. Furthermore, to completely remove eventual residues, physical processes might be used, such as dry processes, in particular ion bombardment produced via plasma, or reactive ion etching.

In the context of the present application, the "handling" of the panel refers to any required or predetermined procedure or operation which can be performed on the panel. For example, handling may comprise transferring or moving the panel from one place to another. It may comprise rotating the panel, flipping the panel or aligning the panel such that it is oriented in a predetermined way. It may comprise inserting the panel into a device, e.g. an accommodation or transportation device, securing the panel to the device and/or removing the panel from the device. The handling of the panel may comprise steps such as measuring or testing the panel. It may further comprise controlling an environment of the panel, e.g. controlling the chemical composition of a gas such as air or of a liquid such as water surrounding the panel e.g. in the accommodation device, or controlling the temperature of the environment. It may be that the handling of the panel does not comprise any processing step, by which the physical structure of the panel, e.g. the geometrical layout or the chemical composition of the panel, is changed.

A "handling tool" for handling a panel is any tool, which can be used for handling the panel. The handling tool may be operable by a human, it may also be operable by a machine or by a robot. A handling tool may in particular be a tool that is used for transferring, rotating, flipping and/or aligning a panel. A handling tool may be a tool, on which a panel can be arranged or to which a panel can be attached so that the panel can be aligned in a certain manner and/or transferred from one place to another. A handling tool may be a tool that is configured to handle only one panel at a time or a tool that is configured to handle several panels at a time. A handling tool may be used for transport and/or storage of panels.

The handling tool comprises a "handling tool handling surface," or surface onto which the panel is arrangeable. The surface may comprise at least parts of a principal surface of the handling tool, where the principal surface may in particular be a flat surface. The handling tool may comprise a plate-shaped element with a main surface of the plate-shaped element being the principal surface. The surface may be the main surface of the plate-shaped element. The main surface of the plate-shaped element may have a convex form.

The handling tool may comprise a rod-shaped element extending from the plate-shaped element, wherein the handling tool is operable, e.g. by a human or a machine, by means of the rod-shaped element. The handling tool or at least a part of the handling tool may have one of a shovel-like form, a peel-like form, a pizza-paddle-like form, or a fork-like form with e.g. two, three, four or more than four prongs. The plate-shaped element may have a supporting base on the side opposite the main surface onto which the panel can be arranged. The plate-shaped element may be formed continuously or it may be perforated, e.g. to prevent air from accumulating beneath the panel. The handling tool may comprise securing elements, with which the panel can be fixed to the handling tool. Such securing elements may for example rely on mechanical or electromagnetic forces. The handling tool may comprise a load port to load and unload a panel from a processing tool and/or an accommodation device, in particular a FOUP. The handling tool may comprise a glove wearable by service personnel.

The plate-shaped element of the handling tool may be thin, in particular sufficiently thin that it may enter into the space between different panels and/or between a panel and a wall in an accommodation device and/or in a processing tool. Thus, the plate-shaped element may be used for inserting into and removing panels from an accommodation device and/or a processing tool. The dimensions of the main surface of the plate-shaped element may be smaller than standard panel sizes. For example, the panels may be larger than $200 \times 200$ mm$^2$, the main surface of the plate-shaped element may be smaller than $250 \times 250$ mm$^2$.

The handling tool may comprise coupling elements in order to attach or secure the handling tool to a processing tool configured for processing the panel or to an accommodation device configured for storing and transferring the panel.

In the context of the application, the "panel handling surface" or handling surface is any part of the surface of the panel configured for being handled by the handling tool. The panel handling surface in particular may be any part of the panel surface, which is configured to come into contact with the handling tool during at least part of the handling. Here, the notion of coming into contact includes within its meaning that the panel handling surface and the handling tool directly touch each other, but it may also include that they touch each other via the protection layer, i.e. with the protection layer in between. The panel handling surface and the handling tool may be considered to be in contact already, when the distance between the panel handling surface and the handling tool is as large as or smaller than the thickness of the protection layer.

The panel handling surface may in particular comprise parts of one of the main surfaces of the panel. The panel handling surface may be the surface portion of the panel surface, with which the panel can be arranged on or attached to the handling tool and which thus comes into contact with the handling tool. The panel handling surface may be that surface portion of the panel, which is configured to be arranged on the handling tool, i.e. which is configured to get at least as close to the handling tool as the thickness of the protection layer. Thus, the panel handling surface may be the surface portion of the panel, which is configured to be in contact with the handling tool during at least part of the handling. Here, the meaning of being in contact allows for the protection layer being arranged between panel and handling tool.

The panel handling surface may be one of the main surfaces of the panel, in particular the main surface comprising the surface portion covered by the protection layer. The panel handling surfaces may also comprise two main surfaces opposite each other. The surface portion covered by the protection layer may be the whole main surface.

With an above-described arrangement and a corresponding method, it may be possible to temporarily protect a panel during interaction with a handling tool as well as during storage and transport of the panel. When the panel is used to manufacture component carriers such as printed circuit boards (PCB), substrate-like PCBs (SLP) or IC (integrated circuit) substrates, both main surfaces of the panel may be particularly sensitive to external influences. They may be particularly sensitive for example because both main surfaces shall be further processed, e.g. by adding a further or second layer or removing at least a part of a layer, or because both main surfaces of the panel have active regions. Here, active surface regions comprise at least one exposed conductive element, e.g. an exposed electrical contact or an exposed conductive path. During processing of the panel, the location of the active regions on the main surfaces may change, e.g. when new layers are added or when parts of existing layers are removed.

It may be advantageous that sensitive and in particular active regions on the panel surface are not touched during handling and transport as this could damage those regions. However, many standard tools for interacting with wafers or panels have been developed for wafers or panels with sensitive or active regions on only one main surface of the wafer or panel. For example, load ports for loading and unloading panels often use large fork-shaped or plate-shaped elements, on which a main surface of the wafer or panel is arranged. If those fork-shaped or plate-shaped elements touch an active surface region of a panel, the active region may be damaged. Therefore, some standard tools for handling wafers and/or panels potentially cannot be used anymore for handling panels with active regions on both main surfaces.

To prevent damage to panels with active regions on both main surfaces, large KOZs ('keep-out zones') could be designated on that main surface of the panel which is touched during handling, e.g. touched by the mentioned fork-shaped or plate-shaped elements. Here, keep-out zones are surface areas, which must not comprise active surface regions. However, such keep-out zones could prevent a high integration of components and functions in the panel. As an alternative to keep-out zones, novel tools could be developed enabling touchless transport and/or handling. For example, such tools should not touch either of the main surfaces during transport and handling. However, the development of novel tools is generally difficult and expensive. It may even be necessary to develop individual handling systems for each processing tool or transport device.

Applying a protection layer to at least a part of the panel surface as proposed in the present application, in particular applying the protection layer to those panel surface areas, which potentially interact with handling tools, may render it possible to keep using standard handling and/or transport tools for handling and/or transporting panels. For example, it may be possible to keep using FOUPs for transport of the panels and load ports with fork- or plate-shaped elements for the handling of panels. At the same time, both main surfaces of the panel can be completely used as active surfaces without any constraints such as keep-out zones.

Applying a protection layer may have further advantages. For example, protection layers may be used as a support structure for particularly thin panels during transport and handling. The layer by itself may already provide additional support to prevent bending or even breaking of the panel. Or, the layer may comprise or be combined with a reinforcing structure providing additional support. Furthermore, the protection layer may reduce the risk of foreign materials (FM) on sensitive surface areas, in particular on active surface areas. Finally, it may also contribute to controlling warpage of the panel.

According to a further exemplary embodiment, the surface portion covered by the protection layer comprises the panel handling surface. This may be advantageous because the whole surface area, with which the panel is arrangeable onto the handling tool, is protected by the protection layer and thus is protected from abrasion or scratching by the handling tool. For example, a main surface of the panel which comprises the panel handling surface may be completely covered by the protection layer.

According to a further exemplary embodiment, the surface portion covered by the protection layer comprises an active surface portion, wherein the active surface portion comprises an exposed conductive element. The exposed conductive element may for example be an exposed electrical contact or an exposed conductive path. Active surface portions in general are more sensitive to external influences, in particular to mechanical influences, compared with non-active surface portions. The functionality of active surface portions, in particular the functionality of exposed conductive elements, may be impaired by external influences. Therefore, it is advantageous to cover active surface portions with a protection layer.

According to a further exemplary embodiment, the panel handling surface comprises an active surface portion. In this case, it is advantageous to cover the respective active surface portion by a protection layer to prevent damage to the active surface portion due to interaction of the panel handling surface with the handling tool.

According to a further exemplary embodiment, the surface portion covered by the protection layer comprises an unfinished surface portion. Unfinished surface portions will be submitted to further processing steps, where further processing steps may in particular comprise adding material to the panel and/or removing material from the panel. In particular, such processing steps may comprise adding further layers to the panel or removing parts of a layer from the panel. In an unfinished state, a surface may be particularly sensitive to external influences. In particular, any damage to the unfinished surface portion may interfere with or impede subsequent processing steps.

According to a further exemplary embodiment, the handling tool handling surface or surface and the panel handling surface are formed in a complementary manner. The handling tool handling surface is a surface of the handling tool configured to handle the panel, in particular a surface of the handling tool, which is configured to be in contact with the panel, possibly with the protection layer in between. Thus, the handling tool handling surface and the panel handling surface are configured to be in contact with each other, possibly with the protection layer in between both surfaces. The two surfaces may be formed in a complementary manner in that they have a complementary profile in a direction perpendicular to the contact plane between the two surfaces. For example, two flat surfaces have a complementary profile. Also, a first surface with a protruding or convex surface portion and a second surface with a corresponding sunken or concave surface portion have a complementary profile. A complementary profile in this sense increases the contact surface and thus reduces the pressure per contact area, which may prevent damage on both surfaces. A complementary profile with convex and concave portions may secure the contact between the panel and the handling tool, in particular it may prevent a sliding along the contact place between the panel and the handling tool.

According to a further exemplary embodiment, at least one protruding element is provided at the edge of the handling tool handling surface. When a panel is arranged on the handling tool handling surface, the protruding element may be located at the circumference of the panel. This may help to fix the panel on the handling tool handling surface.

According to a further exemplary embodiment, the surface portion covered by the protection layer is a patterned surface portion. Such a patterned surface portion may be non-continuous on the main surface, i.e. it may comprise at least two separate, unconnected regions or islands on the main surface. Alternatively or in addition, a patterned surface portion may comprise a hole pattern. The outline of the patterned surface portion may for example correspond to or be slightly larger than the outline of the handling tool handling surface. This ensures that the handling tool handling surface only comes into contact with the protection layer, while efficiently using the material needed for the protection layer.

According to a further exemplary embodiment, the arrangement further comprises an accommodation device for accommodating the panel, wherein the handling tool is configured for at least one of transferring the panel into the accommodation device and transferring the panel out of the accommodation device. An accommodation device for accommodating the panel is any device, in which one or a plurality of panels can be stored. The accommodation device may comprise a casing or housing to protect the panels from outside influences. The casing or housing may comprise an opening or a door, through which panels can be inserted into or taken out from accommodation device. It may for example have a box-like shape. It may for example be a so-called FOSB, Front Opening Shipping Box, or a FOUP, Front Opening Unified Pod, which are standardized devices for the storage and/or transport of wafers or panels.

The accommodation device may be movable and transportable. Such an accommodation device may be advantageous for example for transferring panels between different processing units or tools for processing the panels or between different manufacturing facilities. An accommodation device may provide a controlled environment, e.g. a controlled atmosphere and/or a controlled temperature. At least parts of the accommodation device may for example be filled with a liquid, e.g. water, or a gas of a predetermined chemical composition. It may for example filled with liquid, such that the panel is at least partly, in particular completely immersed in the liquid. A control unit of the accommodation device, e.g. comprising a thermometer, may be configured to provide the stable and controlled environment. Such a controlled environment may help to prevent damage to the panels during transport, e.g. from extreme temperatures.

The accommodation device may have coupling elements, such as pins, holes or coupling plates, and the handling tool may have complementary coupling elements, such as pins, holes or coupling plates, wherein the coupling elements and the complementary coupling elements are configured to attach the accommodation device and handling tool to each other. When the accommodation device and handling tool are attached to each other, the handling tool can reliably insert panels into the accommodation device and/or remove panels from the accommodation device.

The accommodation device comprises supporting or securing elements which support the panels in the accommodation device. In order to protect the panel, the protection layer covers supporting portions of the panel, by which supporting portions of the panel rest on the supporting elements of the accommodation device.

According to a further exemplary embodiment, the accommodation device comprises a slot for storing and securing the panel. The accommodation device may have a plurality of slots for storing and securing a plurality of panels. Such a slot may constrain the motion of the panel, when it is inserted into the slot. For example, the slot may comprise one or more securing elements such as bars, rails or grooves, e.g. at walls of the housing of the accommodation device. These securing elements may be configured so that parts of the panel, in particular edges of the panel, are in contact with and/or rest on these securing elements. Hence, the edges of the panel may form the above-mentioned supporting portions of the panel which are protected by the protection layer. For example, the panel may be slid into or out of rails or grooves, when it is inserted into or taken out of the slot. When the panel is fully inserted into the accommodation device, a further securing element may prevent the panel from sliding out of the accommodation device, for example by locking the further securing element. Between two neighboring slots, sufficient space may be provided such that the handling tool can be at least partially inserted into that space in order to insert a panel in at least one of the slots or to remove a panel from at least one of the slots by means of the handling tool. The panels may be inserted into the accommodation device with the panel handling surface being exposed so that the handling tool can interact with the panel handling surface.

According to a further embodiment, the protection layer comprises a foil or a film. Foils may be easily applicable and easily removable, e.g. by a peeling-off process. Such a foil may be an adhesive foil, it may be a BoPET (biaxially-oriented polyethylene terephthalate) foil, e.g. a Mylar foil. Protection films may be deposited by PVD, CVD or other thin film deposition technologies.

According to a further embodiment, the protection layer comprises a liquid. Liquids may be easily applicable, e.g. by spraying and/or dip coating. They may also be easily removable, e.g. by a washing-off process. Such a liquid material may for example be polyvinylalcohol.

According to a further embodiment, the protection layer comprises a solid plate, which is attached to the main surface. Solid plates may be easily attachable and removable. The solid plate may be attached for example by an adhesive film, by screws or by pins. It may be a glass plate, a steel plate or a plate made from a polymer.

According to a further embodiment, the protection layer is transparent, in particular optically transparent. Transparency may be advantageous for example for inspection of the panel surface under the protection layer. It may be advantageous for measuring or testing various features of the panel surface under the protection layer, in particular for measuring or testing active surface areas under the protection layer. Such measuring or testing may ensure that the panel can be successfully subjected to further processing steps, e.g. during manufacture of component carriers. Furthermore, transparency may be advantageous for example to identify the panel being handled, e.g. using information carrier structures such as bar codes, 2D or multi-dimensional codes, tracking panel location and process parameters along the process chain.

According to a further embodiment, the protection layer comprises a protective structure configured for protecting the panel during handling and a reinforcing structure, different from the protective structure, configured for reinforcing the panel during handling. The outline or footprint of the reinforcing structure may differ from the outline or footprint of the protective structure. The protective structure may be a foil, a liquid or a solid plate as previously described. The reinforcing structure may comprise in particular struts, rods or plates for stabilizing the panel, in particular to prevent bending or warping of the panel. Such an additional protective structure may be particularly useful when handling thin panels with low rigidity or stiffness. Without a reinforcing structure in addition to a protective structure, it may not be possible to securely handle panels, in particular thin panels, by the handling tool and/or to securely store panels in an accommodation device.

According to a further embodiment, a further or second surface portion of a further or second main surface of the panel is covered by a respective protection layer, wherein the main surface and the further main surface are opposite to each other. For example, all main surfaces of the panel, in particular the whole surface of the panel, may be covered by a protection layer. Such a configuration may result e.g. if the protection layer and the further protection layer is applied in a coating process. If both sides of the panel are at least partially protected by a protection layer, they may both be handled by the handling tool. This may be advantageous, for example, when using a handling tool that grips the panel at both main surfaces.

According to a further exemplary embodiment, the handling tool comprises one of a plate, in particular a forked plate, wherein a main surface of the plate comprises the handling tool handling surface. Plates and forked plates are well-suited to provide mechanical support for panels during handling, which are usually flat or at least mostly flat. Plates and forked plates are used in many standard tools for handling panels or wafers, e.g. in standard load ports.

According to a further exemplary embodiment, handling the panel comprises transporting the panel from a processing tool (device) to a further processing tool (device), wherein the processing tool and the further processing tool are configured for processing the panel. A processing of the panel may comprise submitting the panel to a procedure, which adds material to the panel or removes material from the panel, in particular a procedure, which adds at least one layer structure to the panel and/or removes at least part of a layer structure from the panel, e.g. by mechanical or optical drilling or by chemical etching. A processing of the panel may comprise in particular a processing of the surface portion of the panel, which will be or has been covered by the protection layer. A processing of the panel may comprise a physical contacting of that surface portion. The processing by the processing device may comprise, e.g. as the final step, the application of the protection layer to the panel. The processing of the further processing device may comprise, e.g. as the first step, the removal of the protection layer from the panel. Such an embodiment may be advantageous, since the panel is protected by the protection layer during handling by the handling tool and possibly during transport in the accommodation device, while all surfaces can be processed in their entirety in various processing tools.

According to a further exemplary embodiment, the method further comprises detaching the protection layer from the panel after handling the panel and before processing the panel by the further processing device. This may be advantageous since the protection layer can be used to protect sensitive surface areas, e.g. active surface areas, of the panel during handling, while these sensitive surface areas can then be processed by the further processing device.

According to a further exemplary embodiment, the surface portion is covered by the protection layer after processing the panel by the processing device. This may be advantageous since sensitive surface areas, e.g. active surface areas of the panel can be processed by the processing device, while these sensitive surface areas may then be protected by the protection layer during handling.

According to a further exemplary embodiment, detaching the protection layer comprises loosening, in particular detaching (releasing), the protection layer by a laser process. In particular the protection layer may be detached by directing a laser beam onto the protection layer, which breaks off parts of the protection layer. The process may be configured to stop at the surface of the panel.

According to a further exemplary embodiment, detaching the protection layer comprises loosening, in particular detaching (releasing), the protection layer by a washing process. This may be advantageous for example, if the protection layer is a liquid material, which may easily be washed off.

According to a further exemplary embodiment, detaching the protection layer comprises a chemical process. For example, the protection layer may be etched off or it may be etched such that it can be more easily removed by another process, e.g. washed off or peeled off.

According to a further exemplary embodiment, detaching the protection layer comprises the removal of eventual residues on the substrate surface using a physical process. For example, the protection layer may leave a few particles on the substrate surface which might be completely removed by means of plasma or other ion bombardment methods which might include reactive gases such as those used in reactive ion etching, e.g. chlorine-based ($Cl_2$, $BCl_3$, $CCl_4$), fluorine-based ($SF_6$, $CF_4$, $CHF_3$) or oxygen-based ($O_2$, $O_3$, $CO_2$, $H_2O$).

According to a further exemplary embodiment, the panel is submitted to at least one of a measuring procedure and a testing procedure during the handling. For example, features of the panel, such as electrical contacts, conductive paths or electrical components, may be measured and/or tested. They may be measured and/or tested even though they are covered by the protective layer, which may be easier if the protective layer is transparent for testing or measurement signals. The measuring and/or testing may allow for quality control and may allow to single out faulty panels for repair or for discarding right after the processing step, during which an error or malfunction occurs.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may in one example denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable, wet-etchable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon®), a ceramic, and a metal oxide. Teflon is a registered trademark of the Chemours Company FC, LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material for substrates may be used as well. For high frequency applications, high-frequency materials such as polytetrafluoroethylene, liquid crystal polymer and/or cyanate ester resins, low temperature cofired ceramics (LTCC) or other low, very low or ultra-low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the present invention are apparent from the examples of embodiment to be described hereinafter and are explained with reference to the examples of embodiment. The present disclosure will be described in more detail hereinafter with reference to examples of embodiment but to which the present disclosure is not limited.

DETAILED DESCRIPTION OF ILLUSTRATED EMBODIMENTS

Figure 1:
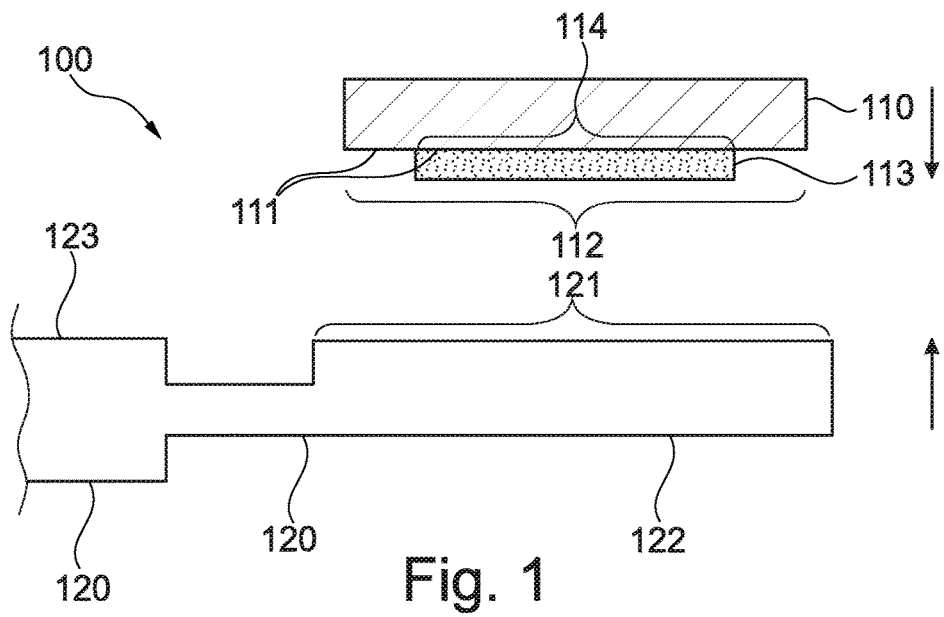
FIG. 1, FIG. 2 and FIG. 3 illustrate schematic cross-sectional views of arrangements according to exemplary embodiments.

The illustrations in the drawings are schematically presented. It is noted that in different figures, similar or identical elements or features are denoted with the same reference signs or with reference signs, which are different from the corresponding reference signs only within the first digit. In order to avoid unnecessary repetition, elements or features which have already been elucidated with respect to a previously described embodiment may not be elucidated again at a later position of the description.

Further, spatially relative terms, such as "front" and "back", "above" and "below", "left" and "right", et cetera are used to describe an element's relationship to other element(s) as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment can assume orientations different from those illustrated in the figures when in use.

Before, referring to the drawings, exemplary embodiments will be described in further detail, some basic considerations will be summarized based on which exemplary embodiments of the patent have been developed.

Handling systems from wafer-based processes could be transferred to process panels. Systems could use a FOUP (front opening unified pod) (accommodation device) for transport of panels or wafers and load ports (handling tools) with forks to load and unload panels or wafers from the FOUP. For a wafer FOUP, the fork may touch or support the wafer from a bottom side. As the wafer has the active side only on the top side, the loader is not touching/damaging an active area. The same principle shall be used for large panels (larger than 250×250 mm$^2$) using a carrier (steel, polymer or glass).

PCBs, SLPs (substrate-like PCBs) and IC substrates have active areas on both sides of the panel. Therefore, either the active zone is being touched or large KOZs (keep-out-zones) for the handling are needed, especially for thin panels with low rigidity/stiffness. The panel FOUP set-up is not compatible with current loading systems. The fork needed at the load port is touching an active area on the bottom side of the panel. For thin panels, enlarged support and space (KOZ) on the bottom side is needed. Thus, an active area may be touched.

To circumvent these problems, a protection layer can be applied at the end of each process step—where the panel or elements therein or thereon could be damaged by touching it—and remove it immediately before the next processing step. This allows the use of equipment for FOPLP (fan-out panel-level packaging, e.g. Panel FOUP) for transport/storage. This layer could be a film (e.g. Mylar foil) or a liquid material (e.g. Polyvinylalcohol), which can be applied easily (e.g. by spray, or dip coating; by chemical vapor deposition (CVD), physical vapor deposition (PVD), roller coating, spray coating) and can be washed off as 1st step in adjacent process step. Thus, active areas on both front and back of the panel may be protected during handling. The protection layer may be protected during handling. Standardized FOUP systems can be used, which provides a cost advantage and contributes to standardization.

Additionally, this protection layer could also lower the risk of foreign material (FM) on the active area of the panels. The protection layer could also contribute to warpage control of the panel.

According to a process flow, a last process step processing the panel in a processing tool is realized. Then the panel is loaded in a magazine, after which step it is transported to and loaded in a next processing tool for further processing.

According to another process flow, a last process step processing the panel in a processing tool is realized. Then a coating is applied to the panel. Afterwards, the panel is loaded in a FOUP and transported in the FOUP. It is then loaded in a next processing tool, in which it is stripped of the protection layer. Finally, a first process is applied to the panel in the next tool.

Conventionally, FOUPs cannot be used for large panels with double-sided active areas. Also, thin panels cannot be handled in FOUPS. This leads to a need for handling frames for touchless transport. Often, individual handling systems are developed for each tool.

FIG. 1 shows a schematic cross-sectional view of an arrangement 100 according to an exemplary embodiment. The arrangement 100 comprises a panel 110 configured as a pre-form for manufacturing a plurality of component carriers; a protection layer 113 covering a surface portion 114 of a main surface 111 of the panel 110, wherein the protection layer 113 is detachable from the surface portion 114 (substantially) without leaving residues on the panel 110; and a handling tool 120 for handling the panel 110, wherein the handling tool 120 comprises a handling tool handling surface 121 onto which the panel 110 is arrangeable; wherein the panel 110 comprises a panel handling surface 112, with which the panel 110 is arrangeable onto the handling tool 120, wherein the panel handling surface 112 comprises at least part of the surface portion 114 covered by the protection layer 113.

The handling tool 120 comprises a rod-shaped element 123, with which the handling tool 120 may be operated, e.g. by a machine. The handling tool further comprises a plate-shaped element 122, from which the rod-shaped element 123 extends. On the plate-shaped element 122, a panel 110 is arranged, as indicated by the arrows. Specifically, the plate-shaped element 122 comprises the handling tool handling surface 121, onto which the panel 110 is arranged.

The panel 110 is arranged on the handling tool handling surface 121 with the panel handling surface 112. The panel handling surface 112 and the handling tool handling surface 121 have complementary profiles. In the embodiment shown in FIG. 1, both surfaces 112, 121 are flat.

The panel handling surface 112 may be smaller than the handling tool handling surface 121 as shown in FIG. 1. Alternatively, the panel handling surface 112 may be larger than or just as large as the handling tool handling surface 121. It may also be that the panel handling surface 112 is larger than the handling tool handling surface 121 in one direction and smaller in another direction.

At least part of the panel handling surface 112 is covered by the protection layer 113. The whole panel handling surface 112 may be covered by the protection layer 113, in particular the whole main surface 111 comprising the panel handling surface 112 may be covered by the protection layer 113.

When the panel handling surface 112 is arranged onto the handling tool handling surface 121, the protection layer 113 may be between the panel handling surface 112 and the handling tool handling surface. Thus, when the panel handling surface 112 is arranged onto the handling tool handling surface 121, both surfaces may not directly touch each other. Instead, the surfaces 112, 121 may be separated from each other by a distance determined by the thickness of the protection layer 113.

Figure 2:
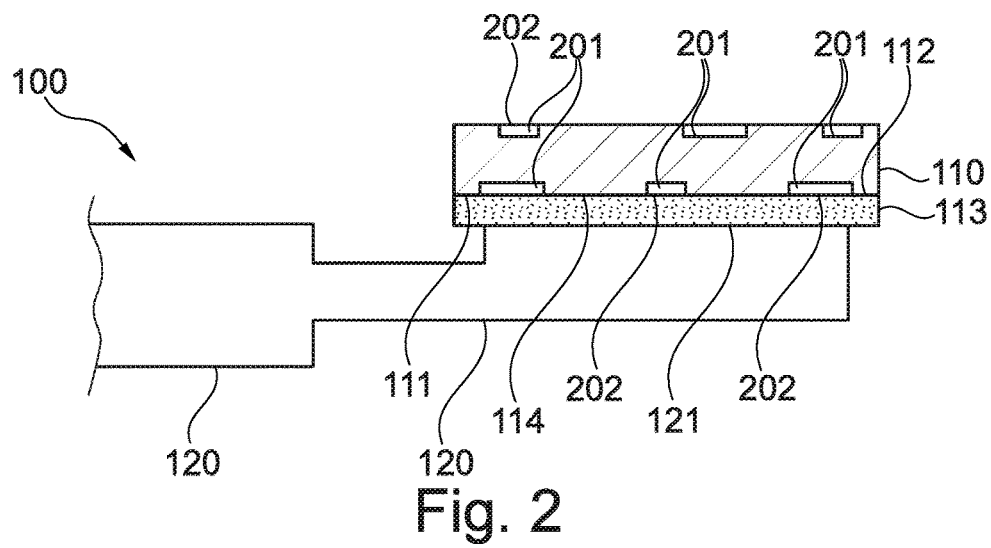

FIG. 2 shows a schematic cross-sectional view of an arrangement 100 according to an exemplary embodiment. A panel 110 with a protection layer 113 covering completely a panel handling surface 112 is arranged on a handling tool handling surface 121 of a handling tool 120. Exposed conductive elements 201, e.g. exposed electrical contacts or exposed conductive paths, are exposed on a main surface 111 of the panel as well as on a further main surface opposite the main surface 111. A surface portion of the panel comprising an exposed conductive element 201 may be an active surface portion 202. The protection layer 113 covers active surface portions 202 of the panel handling surface 112 in order to protect those particularly sensitive active surface portions 202 from damage. In particular, the active surface portions 202 of the panel handling surface 112 are protected from mechanical damage, which may result from mechanical interaction with the handling tool 120.

Figure 3:
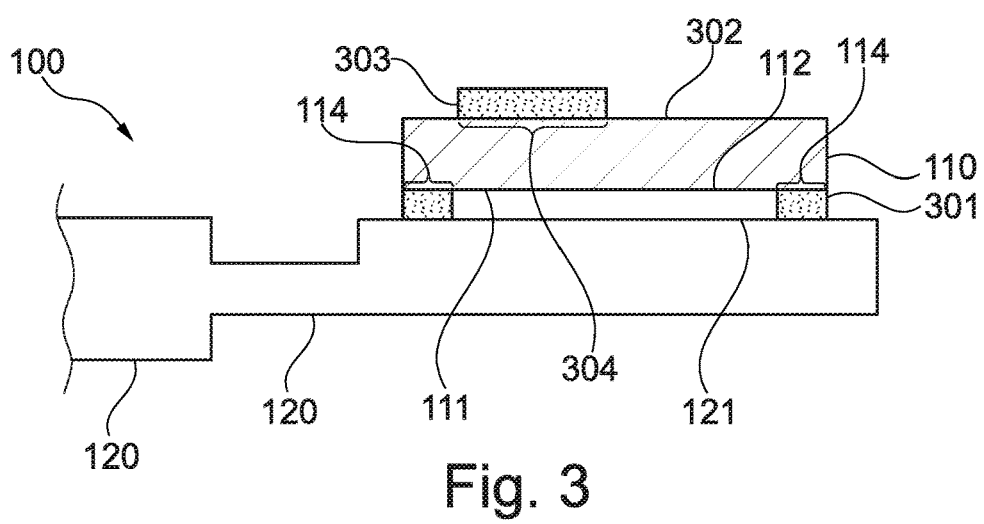

FIG. 3 shows a schematic cross-sectional view of an arrangement 100 according to an exemplary embodiment. A panel 110 with a patterned protection layer 301 covering partially a panel handling surface 112 is arranged on a handling tool handling surface 121 of a handling tool 120. Such a patterned protection layer 301 may be non-continuous on the main surface 111, i.e. it may comprise at least two separate, unconnected regions or islands on the main surface 111. In addition or alternatively, a patterned protection layer 301 may comprise at least one hole, completely surrounded by the patterned protection layer 301. For example, the patterned protection layer 301 may only cover a small strip at the edge of the panel main surface 111. If the protection layer is a patterned protection layer 301, the surface portion 114 covered by the protection layer is patterned as well. Only the patterned protection layer 301 may directly touch the handling tool handling surface 121. For example, if the protection layer 301 comprises or consists of a strip stretching around the whole circumference of the panel main surface 111, only this strip could touch the handling tool handling surface 121. Thereby, even those areas of the panel handling surface 112, which are not covered by the patterned protection layer 301, may be protected from mechanical damage by the handling tool 120.

A further or second main surface 302, opposite the main surface 111, may be covered by a further or second protection layer 303 at a further or second surface portion 304. Thereby, both main surfaces and in particular active or sensitive areas on those main surfaces may be protected from external influences. In case of only partially applying protection layer 113, empty/inactive spaces on panel 110 are used according to design without the need to create KOZ. In the present embodiment, the protection layer 113 actually does not need to be fully removed/removed without residue.

Thus, at least a part of the further main surface may form part of the panel handling surface 112 and may be arrangeable on the handling tool 120.

Figure 4:
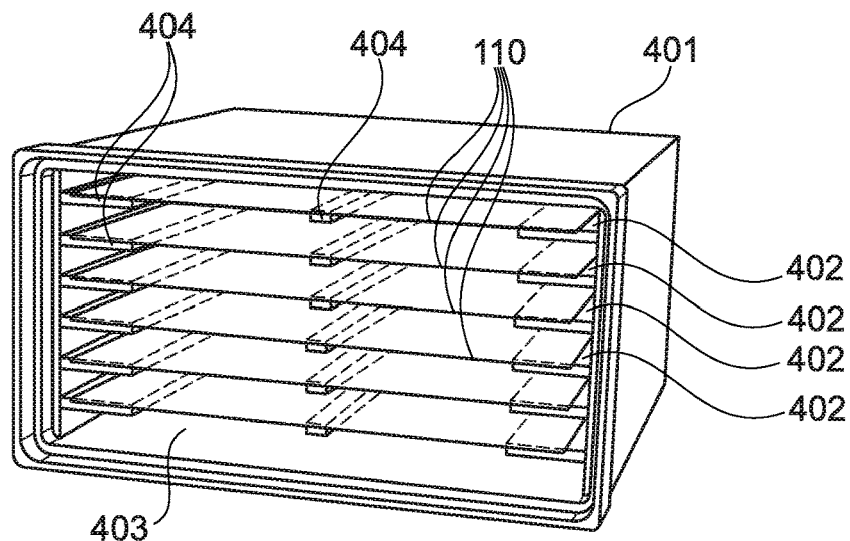
FIG. 4 and FIG. 5 illustrate schematic perspective views of accommodation devices according to exemplary embodiments.

FIG. 4 illustrates a schematic perspectival view of an accommodation device 401 according to an exemplary embodiment. The accommodation device 401 comprises an opening 403 at the front, through which panels 110 can be inserted into or taken out from the accommodation device 401. The accommodation device 401 comprises a plurality of slots 402. Into each slot 402 a panel 110 can be inserted. In the slot 402, movement of the panel 110 is constrained by one or more supporting elements 404. The supporting elements 404 can be arranged at an inner wall of the accommodation device 401 and/or they may also protrude into the interior of the accommodation device 401. They may support the edge of a panel 110 or may also support an interior region of the panel 110. Supporting elements 404 can for example be rails, slits, grooves or bars. They may constrain motion in one or in several directions. They may also prevent bending or warping of the panel 110, when the panel 110 is inserted into the slot 402. Between adjacent slots and/or between a slot and an adjacent wall of the accommodation device 401, there may be clearance space for a handling tool (not shown) to enter in order to remove a panel 110 from the slot 402 or to insert a panel 110 into the slot 402.

Figure 5:
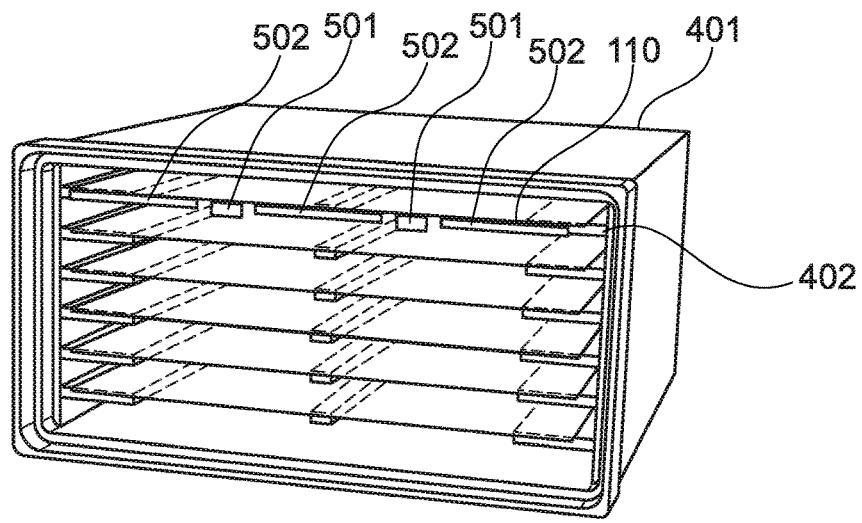

FIG. 5 illustrates a schematic perspectival view of an accommodation device 401 according to an exemplary embodiment. The protection layer of the panel 110 inserted into the uppermost slot 402 comprises a protective structure 501 configured for protecting the panel and a reinforcing structure 502, different from the protective structure 501, configured for reinforcing the panel 110. Such a reinforcing structure 502 may be particularly useful for the handling of thin panels. The reinforcing structure 502 may comprise bars or plates, in particular bars and plates of a solid material. The protective structure 501 may cover the same or different surface portions of the panel 110 compared with the reinforcing structure 502. The protective structure 501 may in particular cover the panel handling surface, while the reinforcing structure 502 need not be present at the panel handling surface. For example, in FIG. 5 a fork-like handling tool could be placed underneath the protective structure 501.

Alternatively and in addition to the reinforcing structure 502, any supporting elements of the accommodation device 401 may also provide reinforcement for particularly thin panels 110, while they are inserted into the accommodation device 401. The supporting elements may be adapted, whether a particular slot 402 is configured to accommodate particularly thin panels or not.

Figure 6:
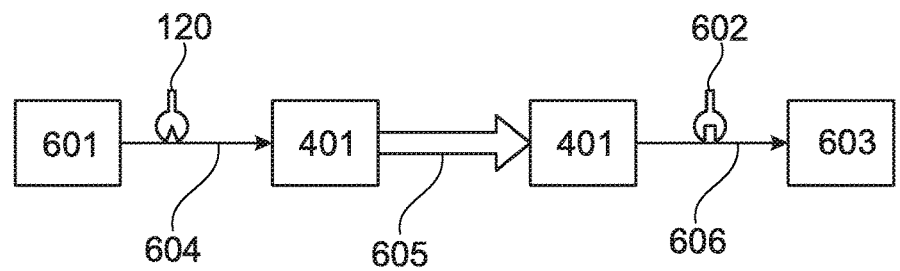
FIG. 6 illustrates a method of transporting panels from one processing tool to a further processing tool according to an exemplary embodiment.

FIG. 6 illustrates a process of transporting panels from a processing tool 601 to a further or second processing tool 603 according to an exemplary embodiment. After being processed by the processing tool 601, a protective layer is applied to the panel. The panel is then taken out as illustrated by the arrow 604 of the processing tool 601 using a handling tool 120. The panel is moved by the handling tool 120 to an accommodation device 401 and inserted into the accommodation device 401 by the handling tool 120. The accommodation device 401 together with the panel is then moved as indicated by the arrow 605 to another location, in particular the location of the next processing step, i.e. the location, where a further processing device 603 is located. As further illustrated by the arrow 606, the panel is taken out of the accommodation device 401 by the handling tool 120 or alternatively by a further or second handling tool 602, moved to the further or second processing tool 603 and inserted into the second processing tool 603. In the second processing tool 603, the protective layer is detached and the panel is subjected to further processing. The handling tool 120 may form part of the processing tool 601 or of the accommodation device 401 and the further or second handling tool 602 may form part of the further or second processing device 603 or of the accommodation device 401.

According to an exemplary process flow, a last processing step processing a panel 110 in a processing tool 601 is realized. Then a coating or protection layer 113 is applied to the panel 110. Afterwards, the panel 110 is loaded in a FOUP 401 and transported in the FOUP 401. It is then loaded in a next processing tool 603, in which it is stripped of the protection layer 113. Finally, a first process is applied to the panel 110 in the next processing tool 603.

FIG. 6 can also be seen to illustrate a method of handling 604, 605, 606 a panel 110. The method comprises (a) providing a panel 110 configured as a pre-form for manufacturing a plurality of component carriers; (b) covering a surface portion 114 of a main surface 111 of the panel 110 with a protection layer 113, wherein the protection layer 113 is detachable from the surface portion 114 without leaving residues on the panel 110; and (c) handling 604, 605, 606 the panel 110 by contacting exclusively the protection layer 113.

Figure 7:
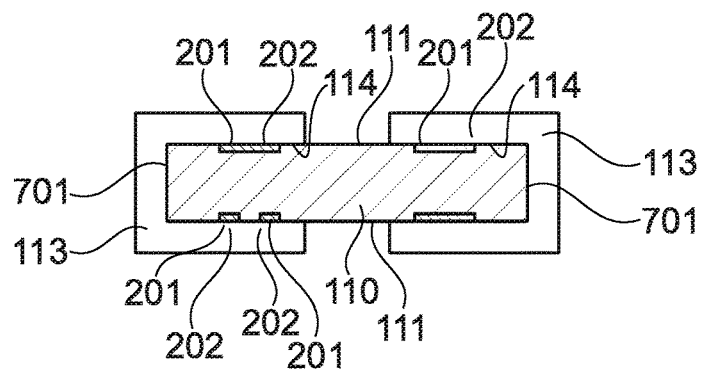
FIG. 7, FIG. 8 and FIG. 9 illustrate schematic cross-sectional views of arrangements according to exemplary embodiments.

FIG. 7 shows a schematic cross-sectional view of an arrangement 100 according to an exemplary embodiment. The arrangement 100 comprises a panel 110 configured as a pre-form for manufacturing a plurality of component carriers. A protection layer 113 covers a surface portion 114 of both opposing main surfaces 111 of the panel 110 and thereby all exposed conductive elements 201 and active surface portions 202. Furthermore, the protection layer 113 covers side surfaces 701 which connects both main surfaces 111. The protection layer 113 is detachable from the surface portion 114 and the side surfaces 701 (substantially) without leaving residues on the panel 110.

Hence, the corners of a panel 110 are covered by protective film (layer 113) and a center part on the main surfaces 111 of the panel 110 are unprotected but still protected from scratches, since the handling tool 120 may grab the respective protected corners of the panel 110.

Figure 8:
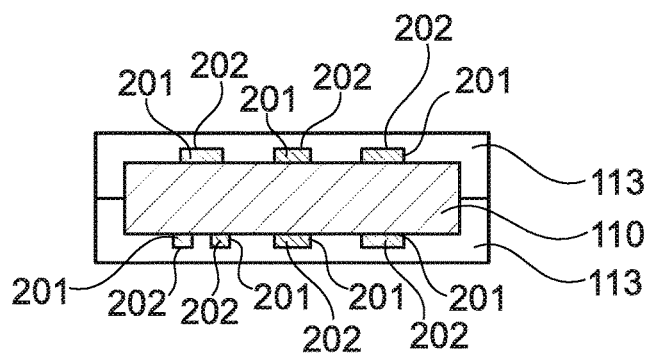

FIG. 8 shows a schematic cross-sectional view of an arrangement 100 according to an exemplary embodiment. The arrangement 100 comprises a panel 110 configured as a pre-form for manufacturing a plurality of component carriers. A protection layer 113 covers the complete surface of the panel 110 and thereby all exposed conductive elements 201 and active surface portions 202. The protection layer 113 is detachable from the surface portion 114 and the side surfaces 701 (substantially) without leaving residues on the panel 110.

Hence, the corners of a panel 110 and the main surfaces 111 are covered by protective film (layer 113). Hence, the protection layer 113 is formed on the full panel 110 to provide a full surface protection in order to protect from mechanic/handling stress as well as from foreign material on all active surfaces 202 at the same time.

Figure 9:
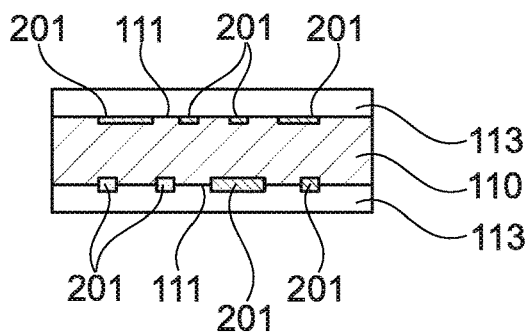

FIG. 9 shows a schematic cross-sectional view of an arrangement 100 according to an exemplary embodiment. The arrangement 100 comprises a panel 110 configured as a pre-form for manufacturing a plurality of component carriers. A protection layer 113 covers the complete main surfaces 111 of the panel 110 and thereby all exposed conductive elements 201 and active surface portions 202. The side surfaces 701 are kept free of the protection layer 113. The protection layer 113 is detachable from the surface portion 114 and the side surfaces 701 (substantially) without leaving residues on the panel 110.

Hence, the main surfaces 111 are covered by protective film (layer 113) to protect the panel 110 from mechanic/handling stress as well as from foreign material on all active surfaces 202 at the same time.

Figure 10:
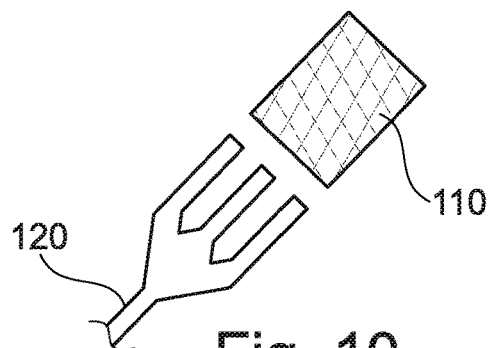
FIG. 10 illustrates an exemplary embodiment of a fork-like handling tool according to an exemplary embodiment.

FIG. 10 shows an exemplary embodiment of the handling tool 120. The handling tool has a fork-like form with e.g. three prongs onto which the panel 110 can rest. The fork-like element may be placed below the panel 110 and, in a next step, lift and transport the panel 110.

Figure 11:
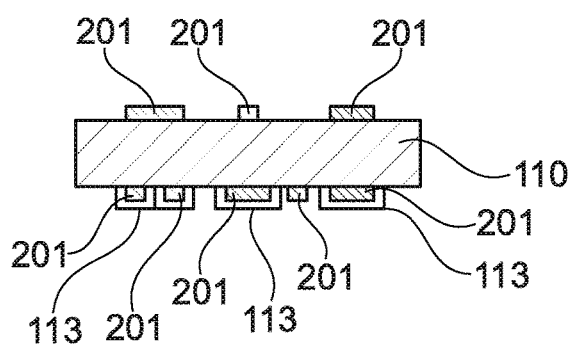
FIG. 11 illustrates a schematic cross-sectional view of an arrangement according to an exemplary embodiment.

FIG. 11 shows a schematic cross-sectional view of an arrangement 100 according to an exemplary embodiment. The arrangement 100 comprises a panel 110 configured as a pre-form for manufacturing a plurality of component carriers. A protection layer 113 covers selective sections of one (in particular only the bottom faced) main surface 111 of the panel 110. The arrangement of the selective sections are adapted to the handling tool 120, such that other sections of the panel 110 being not in contact with the handling tool 120 during handling are free of the protection layer 113 and also accessible e.g. for other tools. In the example shown in FIG. 11, the selective sections comprising the protection layer 113 are formed with respect to the handling tool shown in FIG. 10, such that three selective sections for the three prongs of the fork-like handling tool 120 in FIG. 10 are formed on the main surface 111 of the panel 110. Hence, the exposed conductive elements 201 and active surface portions 202 being arranged within the selective sections are protected by the protection layer 113, wherein other sections, e.g. exposed conductive elements 201', which are not in contact with the handling tool 120 during handling, are free of a protection layer 113.

It should be noted that the term "comprising" does not exclude other elements or steps and the article "a" or "an" does not exclude a plurality. Also, elements described in association with different embodiments may be combined.

Implementation of the patent is not limited to the preferred embodiments shown in the figures and described above. Instead, a multiplicity of variants are possible which use the solutions shown and the principle according to the patent even in the case of fundamentally different embodiments.

REFERENCE NUMERALS 100 arrangement
110 panel
111 main surface
112 panel handling surface
113 protection layer
114 surface portion covered by protection layer
120 handling tool
121 surface
122 plate-shaped element
123 rod-shaped element
201 exposed conductive element
202 active surface portion
301 patterned protection layer
302 second main surface
303 second protection layer
304 second surface portion covered by second protection layer
401 accommodation device
402 slot
403 opening
404 supporting element
501 protective structure
502 reinforcing structure 601 processing tool
602 second handling tool
603 second processing tool
604 unloading and loading the panel
605 transporting the panel
606 further unloading and loading the panel
701 side surface

The invention claimed is:

1. An arrangement, comprising:
   a printed circuit board panel configured as a pre-form for manufacturing a plurality of component carriers;
   wherein the printed circuit board panel comprises a rectangular or quadrangular form when viewed in a direction being perpendicular to two directions of main extension of the printed circuit board panel;
   wherein the component carriers of the plurality of component carriers comprise a stack of at least one electrically insulating layer structure and at least one electrically conductive layer structure;
   wherein the at least one electrically insulating layer structure comprises at least one of the group consisting of reinforced resin, epoxy resin, Bismaleimide-Triazine resin, cyanate ester, polyphenylene derivate, prepreg material, FR-4, FR-5, liquid crystal polymer (LCP), epoxy-based Build-Up Film;
   wherein a surface portion of a main surface of the printed circuit board panel comprises an active surface region and/or an unfinished surface region, wherein the unfinished region is a region to which further printed circuit board layers are added;
   wherein a second surface portion of a second main surface of the printed circuit board panel comprises a second active surface region and/or a second unfinished surface region, wherein the second unfinished surface region is a region to which further printed circuit board layers are added;
   wherein the main surface and the second main surface are opposite to each other;
   a protection layer covering at least part of the surface portion of the main surface of the printed circuit board panel, wherein the protection layer is detachable from the surface portion leaving substantially no residues on the printed circuit board panel; and
   a handling tool for handling the printed circuit board panel, wherein the handling tool comprises a surface onto which the printed circuit board panel is arrangeable;
   wherein a first surface of the protection layer opposed to the main surface of the printed circuit board panel contacts the handling tool;
   wherein the handling tool is configured for at least one of the following: transferring the printed circuit board panel, rotating the printed circuit board panel, flipping the printed circuit board panel,
   wherein the handling tool comprises a plate, wherein a main surface of the plate comprises the surface,
   wherein the handling tool further comprises a handling element that extends from the plate, and
   wherein the handling tool is operable by a human or a machine by means of the handling element.

2. The arrangement according to claim 1, wherein the surface portion covered by the protection layer comprises at least a panel handling surface.

3. The arrangement according to claim 1, wherein the active surface region and/or the second active surface region comprises an exposed conductive element.

4. The arrangement according to claim 1, wherein the surface portion covered by the protection layer comprises the unfinished surface region.

5. The arrangement according to claim 1, wherein the surface and the handling surface are formed in a complementary manner.

6. The arrangement according to claim 1, wherein the surface portion covered by the protection layer is a patterned surface portion.

7. The arrangement according to claim 1, further comprising:
   an accommodation device for accommodating the printed circuit board panel,
   wherein the handling tool is configured for at least one of transferring the printed circuit board panel into the accommodation device and transferring the printed circuit board panel out of the accommodation device,
   wherein the accommodation device comprises a slot for storing and securing the printed circuit board panel.

8. The arrangement according to claim 1, wherein the protection layer comprises a foil or a film.

9. The arrangement according to claim 1, wherein the protection layer comprises a liquid.

10. The arrangement according to claim 1, wherein the protection layer comprises a solid plate, which is attached to the main surface.

11. The arrangement according to claim 1, wherein the protection layer is optically transparent.

12. The arrangement according to claim 1, wherein the protection layer comprises a protective structure configured for protecting the printed circuit board panel during handling and a reinforcing structure, different from the protective structure, configured for reinforcing the printed circuit board panel during handling.

13. The arrangement according to claim 1, wherein the second surface portion of the second main surface of the printed circuit board panel is at least partially covered by a second protection layer, wherein at least one of the protection layer and the second protection layer contact adjacent surfaces of the printed circuit board panel.

14. The arrangement according to claim 1, wherein the protection layer is configured to control warpage of the printed circuit board panel.

15. A method of handling a panel, the method comprising:
   providing an arrangement comprising a printed circuit board panel configured as a pre-form for manufacturing a plurality of component carriers;
   wherein the printed circuit board panel comprises a rectangular or quadrangular form when viewed in a direction being perpendicular to two directions of main extension of the printed circuit board panel;
   wherein the component carriers of the plurality of component carriers comprise a stack of at least one electrically insulating layer structure and at least one electrically conductive layer structure;
   wherein the at least one electrically insulating layer structure comprises at least one of the group consisting of reinforced resin, epoxy resin, Bismaleimide-Triazine resin, cyanate ester, polyphenylene derivate, prepreg material, FR-4, FR-5, liquid crystal polymer (LCP), epoxy-based Build-Up Film;
   wherein a surface portion of a main surface of the printed circuit board panel comprises an active surface region and/or an unfinished surface region, wherein the unfinished region is a region to which further printed circuit board layers are added;

wherein a second surface portion of a second main surface of the printed circuit board panel comprises a second active surface region and/or a second unfinished surface region, wherein the second unfinished region is a region to which further printed circuit board layers are added;

wherein the main surface and the second main surface are opposite to each other;

covering at least a surface portion of a main surface of the printed circuit board panel with a protection layer, wherein the protection layer is detachable from the surface portion leaving substantially no residues on the printed circuit board panel; and handling the printed circuit board panel with a handling tool, wherein the handling tool comprises a surface onto which the printed circuit board panel is arrangeable;

wherein a first surface of the protection layer opposed to the main surface of the printed circuit board panel contacts the handling tool;

wherein the handling tool is configured for at least one of transferring the printed circuit board panel, rotating the printed circuit board panel, flipping the printed circuit board panel, wherein the handling tool comprises a plate, wherein a main surface of the plate comprises the surface, wherein the handling tool further comprises a handling element that extends from the plate, and wherein the handling tool is operable by a human or a machine by means of the handling element.

16. The method according to claim 15, wherein handling the printed circuit board panel comprises:

transporting the printed circuit board panel from a processing tool to a second processing tool, wherein the processing tool and the second processing tool are configured for processing the printed circuit board panel.

17. The method according to claim 16, wherein the method further comprises:

detaching the protection layer from the printed circuit board panel after handling the printed circuit board panel and before processing the printed circuit board panel by the second processing tool.

18. The method according to claim 17, wherein detaching the protection layer comprises detaching the protection layer by a laser process.

19. The method according to claim 17, wherein detaching the protection layer comprises detaching the protection layer by a washing process.

20. The method according to claim 17, wherein detaching the protection layer comprises removing the protection layer and/or the residues of the protection layer by a physical process.

21. The method according to claim 15, wherein, during handling of the printed circuit board panel, the printed circuit board panel is submitted to at least one of a measuring procedure and a testing procedure.

* * * * *